United States Patent
Lee

(10) Patent No.: US 11,200,960 B2
(45) Date of Patent: Dec. 14, 2021

(54) MEMORY SYSTEM, DATA PROCESSING SYSTEM AND OPERATION METHOD OF THE SAME

(71) Applicant: SK hynix Inc., Gyeonggi-do (KR)

(72) Inventor: Jong-Min Lee, Seoul (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 16/794,804

(22) Filed: Feb. 19, 2020

(65) Prior Publication Data

US 2021/0098070 A1   Apr. 1, 2021

(30) Foreign Application Priority Data

Sep. 30, 2019   (KR) ........................ 10-2019-0120795

(51) Int. Cl.
| | |
|---|---|
| G11C 29/00 | (2006.01) |
| G11C 29/38 | (2006.01) |
| G11C 29/44 | (2006.01) |
| G11C 16/34 | (2006.01) |
| G11C 16/26 | (2006.01) |
| G11C 16/04 | (2006.01) |
| G11C 29/12 | (2006.01) |

(52) U.S. Cl.
CPC .............. *G11C 29/38* (2013.01); *G11C 16/26* (2013.01); *G11C 16/3422* (2013.01); *G11C 29/44* (2013.01); *G11C 16/0483* (2013.01); *G11C 2029/1202* (2013.01)

(58) Field of Classification Search
None
See application file for complete search history.

(56) References Cited

U.S. PATENT DOCUMENTS

| | | | |
|---|---|---|---|
| 2013/0294168 A1* | 11/2013 | Shirakawa ......... | G11C 16/0483 365/185.17 |
| 2014/0068384 A1* | 3/2014 | Kwak ................ | G06F 11/1068 714/773 |
| 2014/0229761 A1* | 8/2014 | Okubo ............... | G06F 11/1048 714/6.11 |
| 2015/0154069 A1* | 6/2015 | Tuers ................. | G06F 11/1072 714/773 |
| 2016/0260495 A1* | 9/2016 | Paudel ................ | G11C 29/025 |
| 2017/0330635 A1* | 11/2017 | Shepard ............... | G11C 16/06 |
| 2018/0067666 A1* | 3/2018 | d'Abreu .............. | G06F 3/0619 |
| 2019/0237154 A1* | 8/2019 | Choi .................... | G11C 29/02 |

FOREIGN PATENT DOCUMENTS

| | | |
|---|---|---|
| KR | 10-2016-0071948 | 6/2016 |
| KR | 10-1626528 | 6/2016 |

* cited by examiner

*Primary Examiner* — Guerrier Merant
(74) *Attorney, Agent, or Firm* — IP & T Group LLP

(57) ABSTRACT

A memory system includes a memory device including a plurality of memory blocks, each block having a plurality of pages to store data; and a controller suitable for detecting a number of error bits from data stored in the plurality of pages; summing the number of error bits; generating a bad word line list based on the sum of the error bits; and performing a test read operation on the plurality of pages based on the bad word line list.

18 Claims, 7 Drawing Sheets

MEMORY SYSTEM, DATA PROCESSING SYSTEM AND OPERATION METHOD OF THE SAME

CROSS-REFERENCE TO RELATED APPLICATION

This patent application claims priority to Korean Patent Application No. 10-2019-0120795, filed on Sep. 30, 2019, the entire disclosure of which is incorporated herein by reference.

TECHNICAL FIELD

Various embodiments of the disclosure generally relate to a memory system. Particularly, the embodiments relate to a memory system, a data processing system and an operation method of operating the same for performing a test read operation based on a bad word line list.

BACKGROUND

Recently, the computer environment paradigm has shifted to ubiquitous computing, which enables a computer system to be used virtually anytime and anywhere. As a result, the use of portable electronic devices such as mobile phones, digital cameras, notebook computers and the like have been rapidly increasing. Such portable electronic devices typically use or include a memory system that uses at least one memory device, i.e., a data storage device. The data storage device can be used as a main storage device or an auxiliary storage device of a portable electronic device.

Unlike characteristics of a hard disk, a data storage device using a nonvolatile memory device has advantages such as excellent stability and durability, because it has no mechanical driving part (e.g., a mechanical arm), has high data access speed and low power consumption. In the context of a memory system having such advantages, a data storage device includes a universal serial bus (USB) memory device, a memory card having various interfaces, a solid state drive (SSD) or the like.

SUMMARY

Embodiments of the invention are directed to a memory system, a data processing system and an operation method of the same capable of generating a bad word line list based on a sum of error bits of word lines in a plurality of memory blocks, and performing a test read operation based on the bad word line list.

The disclosure provides a method and an apparatus capable of improving reliability of a memory system by summing the number of error bits of the word lines in the plurality of memory blocks, calculating an average of the sum, and generating a bad word line list including the word lines in which the number of error bits is greater than the average.

In an embodiment, a memory system may include a memory device including a plurality of memory blocks, each block having a plurality of pages to store data; and a controller suitable for detecting a number of error bits from data stored in the plurality of pages; summing the number of error bits; generating a bad word line list based on the sum of the error bits; and performing a test read operation on the plurality of pages based on the bad word line list.

The controller may include an error-bit-count component suitable for summing the number of error bits word line by word line based on the error bits detected from a specific memory block among the plurality of memory blocks; a buffer memory component suitable for storing a value of the sum; an error-bit management component suitable for generating the bad word line list based on the sum; and a test read component suitable for performing the test read operation on the plurality of pages in each of the plurality of memory blocks based on the bad word line list.

Error-bit management component may calculate an average of the sum, and include word lines each having a greater number of error bits than the average in the bad word line list.

The error-bit management component may arrange the word lines in the bad word line list in an ascending order or a descending order according to a number of the error bits.

The error-bit management component may detect a word line having a greatest number of error bits from the bad word line list.

The controller may perform a read disturbance test operation for detecting and summing, by reading the plurality of pages coupled to M number of word lines in a specific memory block after a stress test is applied to N number of word lines in the specific memory block of the plurality of memory blocks, where M and N are natural numbers, and M is greater than N.

The controller may accumulate the error bits by repeatedly performing the read disturbance test operation on the plurality of pages in the specific memory block.

The controller may calculate an average of the accumulated error bits, and include word lines each having a greater number of accumulated error bits than the average in the bad word line list.

The controller may arrange the word lines in the bad word line list in an ascending order or a descending order according to a number of the accumulated error bits.

In another embodiment, an operation method of a memory system may include detecting a number of error bits from data stored in a plurality of pages in a plurality of memory blocks of a memory device; summing the number of error bits; calculating an average of the summed error bits; generating a bad word line list such that word lines each having a greater number of error bits than the average are included in the bad word line list; and performing a test read operation based on the bad word line list.

The generating may include arranging the bad word lines in the bad word line list in an ascending order or a descending order according to a number of the error bits.

The generating may include detecting a word line having a greatest number of the error bits from the bad word line list.

The error bits may be detected by reading the plurality of pages coupled to M number of word lines in a specific memory block after a stress test is applied to N number of word lines in the specific memory block of the plurality of memory blocks, where M and N are natural numbers, and M is greater than N.

The summing may include accumulating the error bits by repeatedly performing a read disturbance test operation of detecting and summing on the plurality of pages in the specific memory block.

The summed error bits may be the accumulated error bits, and the bad word line list may be generated such that the word lines each having a greater number of the accumulated error bits than the average are included in the bad word line list.

In another embodiment, a data processing system may include a host suitable for generating read data and a read command; and a memory system comprising: a memory device including a plurality of memory blocks, each block having a plurality of pages to store data; and a controller suitable for detecting a number of error bits from data stored in the plurality of pages; summing the number of error bits; generating a bad word line list based on the sum of the error bits; and performing a test read operation on the plurality of pages based on the bad word line list.

The memory system may calculate an average of the sum, and includes word lines each having a greater number of error bits than the average in the bad word line list.

The memory system may arrange the word lines in the bad word line list in an ascending order or a descending order according to a number of the error bits.

The memory system may perform a read disturbance test operation of detecting and summing by reading the plurality of pages coupled to M number of word lines in a specific memory block after a stress test is applied to N number of word lines in the specific memory block of the plurality of memory blocks, where M and N are natural numbers, and M is greater than N.

The memory system may accumulate the error bits by repeatedly performing the read disturbance test operation on the plurality of pages in the specific memory block.

The memory system may detect a word line having a greatest number of error bits from the bad word line list.

In another embodiment, an operating method of a controller for controlling a memory device including plural pages, the operating method may include selecting two or more bad word lines coupled to the pages according to an average number of error bits detected from the pages; and controlling the memory device to perform a test read operation on the pages coupled to the bad word lines according to a rank of numbers of the detected error bits from the respective pages coupled to the bad word lines.

BRIEF DESCRIPTION OF THE DRAWINGS

The description herein makes reference to the accompanying drawings wherein like reference numerals refer to like parts throughout the several views, and wherein.

DETAILED DESCRIPTION

Figure 1:
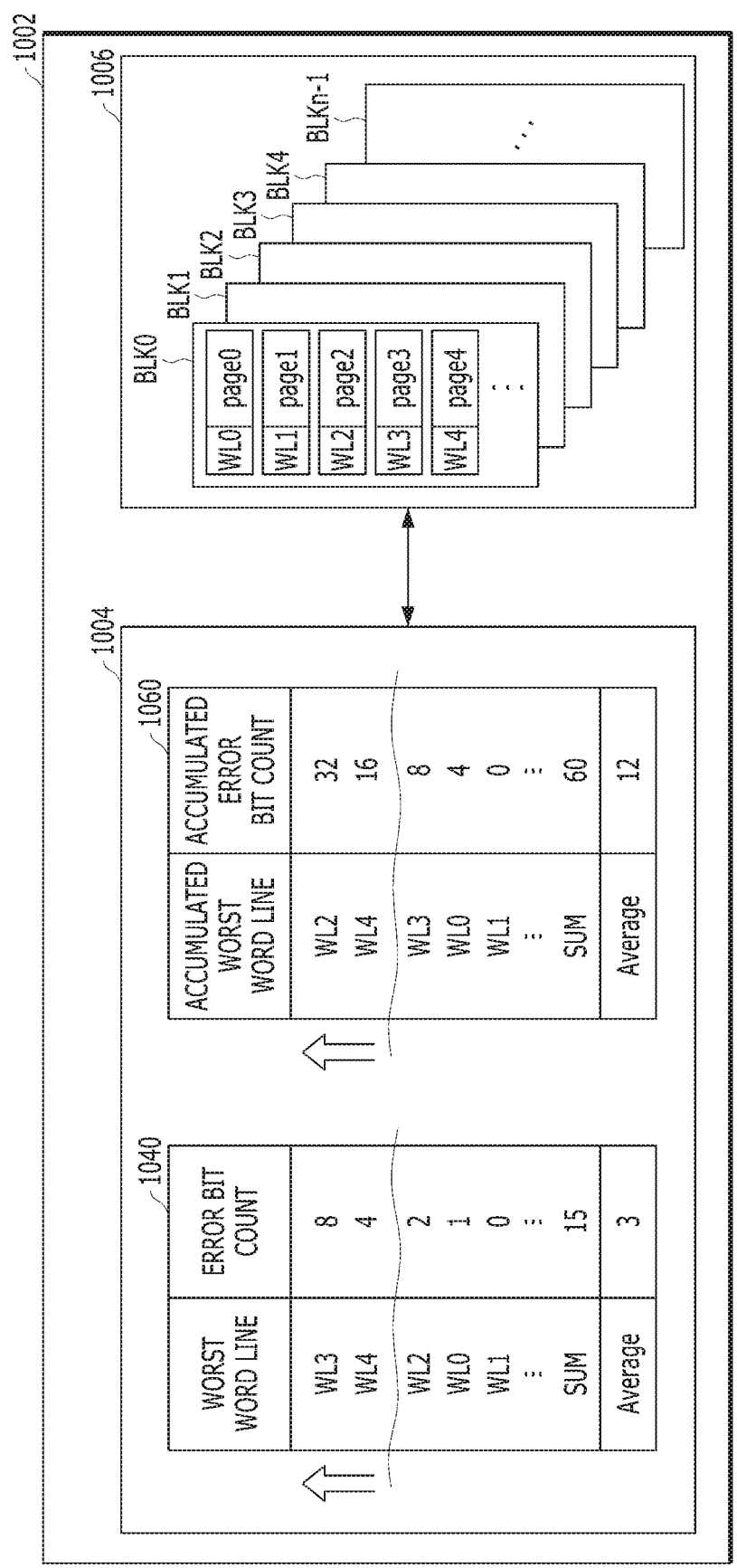
FIG. 1 is a diagram illustrating a memory system in accordance with an embodiment of the disclosure.

Various examples of the disclosure are described below in more detail with reference to the accompanying drawings. The disclosure may be embodied in other embodiments, forms and variations thereof and should not be construed as being limited to the embodiments set forth herein. Rather, the described embodiments are provided so that this disclosure is thorough and complete, and fully conveys the disclosure to those skilled in the art to which this invention pertains. Throughout the disclosure, like reference numerals refer to like parts throughout the various figures and examples of the disclosure. It is noted that reference to "an embodiment," "another embodiment" or the like does not necessarily mean only one embodiment, and different references to any such phrase are not necessarily to the same embodiment(s).

It will be understood that, although the terms "first", "second", "third", and so on may be used herein to identify various elements, these elements are not limited by these terms. These terms are used to distinguish one element from another element that otherwise have the same or similar names. Thus, a first element in one instance may be referred to as a second or third element in another instance without departing from the spirit and scope of the invention.

The drawings are not necessarily to scale and, in some instances, proportions may have been exaggerated in order to clearly illustrate features of the embodiments. When an element is referred to as being connected or coupled to another element, it should be understood that the former can be directly connected or coupled to the latter, or electrically connected or coupled to the latter via one or more intervening elements. Communication between two elements, whether directly or indirectly connected/coupled, may be wired or wireless, unless the context indicates otherwise. In addition, it will also be understood that when an element is referred to as being "between" two elements, it may be the only element between the two elements, or one or more intervening elements may also be present.

The terminology used herein is for the purpose of describing particular embodiments only and is not intended to be limiting of the invention.

As used herein, singular forms are intended to include the plural forms and vice versa, unless the context clearly indicates otherwise. The articles 'a' and 'an' as used in this application and the appended claims should generally be construed to mean 'one or more' unless specified otherwise or it is clear from context to be directed to a singular form.

It will be further understood that the terms "comprises," "comprising," "includes," and "including" when used in this specification, specify the presence of the stated elements and do not preclude the presence or addition of one or more other elements. As used herein, the term "and/or" includes any and all combinations of one or more of the associated listed items.

Unless otherwise defined, all terms including technical and scientific terms used herein have the same meaning as commonly understood by one of ordinary skill in the art to which the disclosure pertains. It will be further understood that terms, such as those defined in commonly used dictionaries, should be interpreted as having a meaning that is consistent with their meaning in the context of the disclosure and the relevant art, and will not be interpreted in an idealized or overly formal sense unless expressly so defined herein.

In the following description, numerous specific details are set forth in order to provide a thorough understanding of the invention. The invention may be practiced without some or all of these specific details. In other instances, well-known process structures and/or processes have not been described in detail in order not to unnecessarily obscure the invention.

It is also noted, that in some instances, as would be apparent to those skilled in the relevant art, a feature or element described in connection with one embodiment may be used singly or in combination with other features or elements of another embodiment, unless otherwise specifically indicated.

Embodiments of the disclosure are described in detail with reference to the accompanied drawings.

FIG. 1 illustrates a memory system 1002 in accordance with an embodiment of the disclosure. Referring to FIG. 1, the memory system 1002 may include a controller 1004 and a memory device 1006.

In general, when a read operation is repeated on a particular memory block within a nonvolatile memory device such as a flash memory device, a threshold voltage level of memory cells within the particular memory block may shift and data stored in the memory cells may be damaged. Such damage may be referred to as a read disturbance. The read disturbance may cause an increase of errors in the data stored in the memory cells. A read disturbance test may be performed on a memory block to test a disturbance stress of pages within the memory block.

The memory device 1006 may include a plurality of memory blocks, i.e., BLK0, BLK1, BLK2, BLK3, BLK4, . . . and BLKn-1, each memory block having a plurality of pages, i.e., Page0, Page1, Page2, Page3, Page4, . . . , Pagen-1 to store data. The plurality of pages may each be coupled to a respective one of a plurality of word lines, i.e., WL0, WL1, WL2, WL3, WL4, . . . and WLn-1. For example, the plurality of pages Page0, Page1, Page2, Page3, Page4 . . . , Pagen-1 include first to fifth pages Page0 to Page4 coupled respectively to first to fifth word lines WL0 to WL4 in this embodiment.

Error bits corresponding to the page coupled to a word line may be detected from the data stored in the memory cells included in the page coupled to the word line. The error bits may be detected through a read disturbance test operation on the page coupled to the word line. In this disclosure, a word line having error bits may mean a word line, to which the error bits are detected from data stored in memory cells included in the page coupled to the word line.

The controller 1004 may sum the error bit count for each word line, e.g., the number of error bits for each of one of the word lines WL0 to WL4 coupled to the first to fifth pages Page0 to Page4, and generate a bad word line list 1040.

The bad word line list 1040 may be generated based on the summed error bits. For example, the controller 1004 may calculate an average of the summed error bits for the word lines, and compare the error bits of each word line to the average. Those word lines that have a greater number of error bits than the average may be selected as a bad word line and may be included in the bad word line list 1040. Also, the bad word lines included in the bad word line list 1040 may be arranged in an ascending order or a descending order according to the number of error bits. The bad word line list 1040 may be stored in a separate storage region of a controller 1004.

The controller 1004 may detect the bad word lines among the word lines of the plurality of memory blocks using the bad word line list 1040. The controller 1004 may perform a test read operation on the memory blocks according to the order defined in the bad word line list 1040.

Specifically, the memory device 1006 may include specific memory blocks BLK0, BLK1, BLK2, BLK3 and BLK4 among the plurality of memory blocks BLK0, BLK1, BLK2, BLK3, BLK4, . . . , BLKn-1, and detect error bits from data stored in memory cells included in the plurality of pages Page0, Page1, Page2, Page3, Page4 . . . , Pagen-1 in each of the specific memory blocks BLK0, BLK1, BLK2, BLK3 and BLK4. The plurality of pages Page0, Page1, Page2, Page3, Page4 . . . , Pagen-1 may be coupled to the plurality of word lines WL0, WL1, WL2, WL3, WL4, . . . , WLn-1. For example, the five word lines WL0 to WL4 of the first block BLK0 may have error bits of '1' bit, '0' bit, '2' bit, '8' bit' and '4' bit, respectively. Values of the error bits may be stored in the corresponding memory block or a separate memory block.

The controller 1004 may sum the number of error bits, the values of which are stored in the memory device 1006, calculate the average of the summed error bits, and generate the bad word line list 1040 such that the fourth and fifth word lines WL3 and WL4 each having a greater number of error bits than the average are selected bad word lines and included in the bad word line list 1040. In this example, the summed number of error bits is '15' and the average is '3'.

The fourth and fifth word lines WL3 and WL4 having a greater number of error bits than the average may be arranged in a descending order in the bad word line list 1040. Herein, the first to third word lines WL0 to WL2 having a less number of error bits than the average may be excluded from the bad word line list 1040.

Furthermore, the bad word line list 1040 may be stored in a storage area of the controller 1004.

The controller 1004 may perform the test read operation on the plurality of memory blocks according to the order defined in the bad word line list 1040.

In another embodiment, the controller 1004 may perform a read disturbance test operation for detecting the error bits from data stored in memory cells included in each of the plurality of pages coupled to M number of word lines in the specific memory block after a stress test is applied to N number of word lines in the specific memory block of the plurality of memory blocks, where M and N are natural numbers, and M is greater than N.

The controller may accumulate the error bits by performing the read disturbance test operations k number of times on the plurality of pages coupled to M number of word lines in the specific memory block among the plurality of memory blocks, where K is a natural number.

As exemplified in FIG. 1, the controller 1004 may calculate the average of the accumulated error bits, and the third word line WL2 and the fifth word line WL4 having a greater number of the accumulated error bits than the average of the accumulated error bits may be included in an accumulated bad word line list 1060.

For example, the accumulated error bits of the first to fifth word lines WL0 to WL4 may be '4' bit, '0' bit, '32' bit, '8' bit and '16' bit, respectively. Values of the accumulated error bits may be stored in the corresponding memory block or a separate memory block.

The controller 1004 may sum the accumulated error bits, the values of which are stored in the memory device 1006, calculate the average of the accumulated error bits, and generate the accumulated bad word line list 1060 such that the third and fifth word lines WL2 and WL4 each having a greater number of accumulated error bits than the average of the accumulated error bits are selected as accumulated bad word lines and included in the accumulated bad word line list 1060. The sum of the accumulated error bits is '60' and the average of the accumulated error bits is '12'.

The third and fifth word lines WL2 and WL4 having the greatest number of accumulated error bits may be arranged in a descending order. Herein, the first word line WL0, the second word line WL1 and the fourth word line WL3 having a less number of accumulated error bits than the average of the accumulated error bits may be excluded from the accumulated bad word line list 1060.

Furthermore, the bad word lines included in the accumulated bad word line list 1060 may be arranged in ascending order or descending order according to the number of error bits. The controller 1004 may perform the test read operation on the specific memory blocks according to the order defined in the accumulated bad word line list 1060.

In response to the read command transferred from the host, the controller 1004 may perform the test read operation on the plurality of memory blocks according to the order defined in the accumulated bad word line list 1060.

Figure 2:
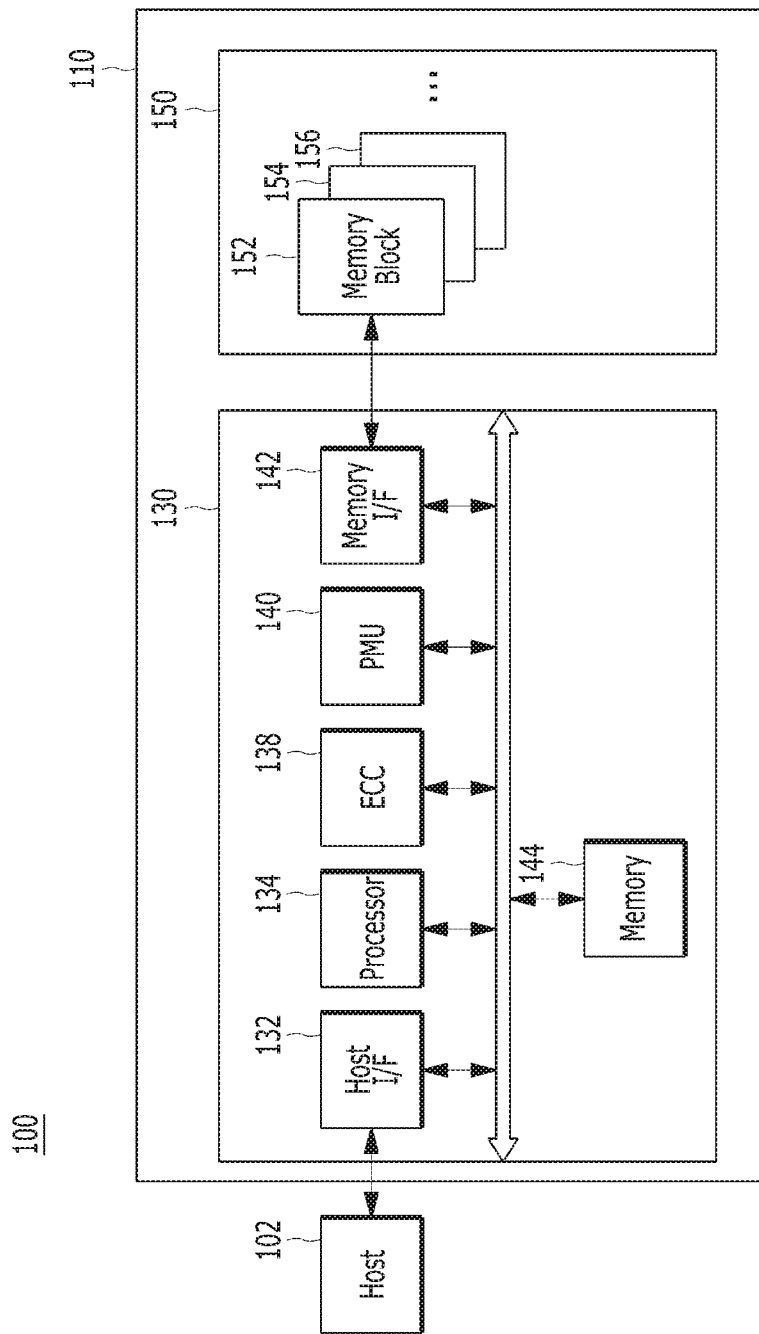
FIG. 2 is a block diagram illustrating a data processing system including a memory system in accordance with an embodiment of the disclosure.

FIG. 2 illustrates a data processing system 100 in accordance with an embodiment of the disclosure. Referring to FIG. 2, the data processing system 100 may include a host 102 operably engaged with a memory system 110.

The host 102 may include a portable electronic device such as a mobile phone, an MP3 player and a laptop computer or an electronic device such as a desktop computer, a game player, a television (TV), a projector and the like.

The host 102 includes at least one operating system (OS), which may generally manage, and control, functions and operations performed in the host 102. The OS may provide interoperability between the host 102 engaged with the memory system 110 and the user needing and using the memory system 110. The OS may support functions and operations corresponding to user's requests. By way of example but not limitation, the OS may be a general operating system or a mobile operating system according to mobility of the host 102. The general operating system may be split into a personal operating system and an enterprise operating system according to system requirements or a user's environment. The personal operating system, including Windows and Chrome, may be subject to support services for general purposes. The enterprise operating systems may be specialized for securing and supporting high performance, including Windows servers, Linux, and Unix. Further, the mobile operating system may include an Android, an iOS, and a Windows mobile. The mobile operating system may be subject to support services or functions for mobility (e.g., a power saving function). The host 102 may include a plurality of operating systems. The host 102 may execute multiple operating systems in connection with operation of the memory system 110, corresponding to a user's request. The host 102 may transmit a plurality of commands corresponding to a user's requests into the memory system 110, thereby performing operations corresponding to commands within the memory system 110. Handling plural commands in the memory system 110 is described below, referring to FIGS. 4 and 5.

The memory system 110 may operate or perform a specific function or operation in response to a request from the host 102. Particularly, the memory system 110 may store data to be accessed by the host 102. The memory system 110 may be used as a main memory system or an auxiliary memory system of the host 102. The memory system 110 may be implemented with any of various types of storage devices, which may be electrically coupled with the host 102, according to a protocol of a host interface. Non-limiting examples of suitable storage devices include a solid state drive (SSD), a multimedia card (MMC), an embedded MMC (eMMC), a reduced size MMC (RS-MMC), a micro-MMC, a secure digital (SD) card, a mini-SD, a micro-SD, a universal serial bus (USB) storage device, a universal flash storage (UFS) device, a compact flash (CF) card, a smart media (SM) card, and a memory stick.

The storage device(s) for the memory system 110 may be implemented with a volatile memory device such as a dynamic random access memory (DRAM) and a static RAM (SRAM), and/or a nonvolatile memory device such as a read only memory (ROM), a mask ROM (MROM), a programmable ROM (PROM), an erasable programmable ROM (EPROM), an electrically erasable programmable ROM (EEPROM), a ferroelectric RAM (FRAM), a phase-change RAM (PRAM), a magneto-resistive RAM (MRAM), a resistive RAM (RRAM or ReRAM) and a flash memory.

The memory system 110 may include a controller 130 and a memory device 150. The memory device 150 may store data to be accessed by the host 102. The controller 130 may control storage of data in the memory device 150. The memory device 150 in FIG. 2 may correspond to the memory device 1006 in FIG. 1, while the controller 130 in FIG. 2 may correspond to the controller 1004 in FIG. 1.

The controller 130 and the memory device 150 may be integrated into a single semiconductor device, which may be included in any of the various types of memory systems as exemplified above.

By way of example but not limitation, the controller 130 and the memory device 150 may be integrated into a single semiconductor device for improving operation speed. When the memory system 110 is used as an SSD, the operating speed of the host 102 connected to the memory system 110 may be improved more than that of the host 102 implemented with a hard disk. In addition, the controller 130 and the memory device 150 integrated into one semiconductor device may form a memory card, such as a smart media card (e.g., SM, SMC), a memory stick, a multimedia card (e.g., MMC, RS-MMC, MMC micro), a secure digital (SD) card (e.g., SD, miniSD, microSD, SDHC), or a universal flash memory.

The memory system 110 may be configured as a part of a computer, an ultra-mobile PC (UMPC), a workstation, a net-book, a personal digital assistant (PDA), a portable computer, a web tablet, a tablet computer, a wireless phone, a mobile phone, a smart phone, an e-book, a portable multimedia player (PMP), a portable game player, a navigation system, a black box, a digital camera, a digital multimedia broadcasting (DMB) player, a 3-dimensional (3D) television, a smart television, a digital audio recorder, a digital audio player, a digital picture recorder, a digital picture player, a digital video recorder, a digital video player, a storage configuring a data center, a device capable of transmitting and receiving information under a wireless environment, one of various electronic devices configuring a home network, one of various electronic devices configuring a computer network, one of various electronic devices configuring a telematics network, a radio frequency identification (RFID) device, or one of various components configuring a computing system.

The memory device 150 may be a nonvolatile memory device and may retain data stored therein even when electrical power is not supplied. The memory device 150 may store data provided from the host 102 through a write operation, while providing data stored therein to the host 102 through a read operation. The memory device 150 may include a plurality of memory blocks 152, 154, 156. Each of the memory blocks 152, 154, 156 may include a plurality of pages. Each of the plurality of pages may include a plurality of memory cells to which a plurality of word lines (WL) are electrically coupled. The memory device 150 also includes a plurality of memory dies including a plurality of planes, each of which includes a plurality of memory blocks 152, 154, 156. In addition, the memory device 150 may be a non-volatile memory device, for example a flash memory, which may be a three-dimensional stack structure.

The controller 130 may control overall operations of the memory device 150, such as read, write, program, and erase operations. For example, the controller 130 may control the memory device 150 in response to a request from the host 102. The controller 130 may provide the data, which is read from the memory device 150, to the host 102. The controller 130 may store the data, which is provided by the host 102, into the memory device 150.

The controller 130 may include a host interface (I/F) 132, a processor 134, an error correction code (ECC) circuit 138, a power management unit (PMU) 140, a memory interface (I/F) 142 and a memory 144, all operatively coupled via an internal bus.

The host interface 132 may process commands and data provided from the host 102. The host interface 132 may communicate with the host 102 through at least one of various interface protocols such as universal serial bus (USB), multimedia card (MMC), peripheral component interconnect-express (PCI-e or PCIe), small computer system interface (SCSI), serial-attached SCSI (SAS), serial advanced technology attachment (SATA), parallel advanced technology attachment (DATA), small computer system interface (SCSI), enhanced small disk interface (ESDI) and integrated drive electronics (IDE). In an embodiment, the host interface 132 is a component for exchanging data with the host 102, which may be implemented through firmware called a host interface layer (HIL).

The ECC circuit 138 may correct error bits of the data to be processed in (e.g., outputted from) the memory device 150. The ECC circuit 138 may include an ECC encoder and an ECC decoder. The ECC encoder may perform error correction encoding on data to be programmed in the memory device 150 to generate encoded data into which a parity bit is added, and store the encoded data in memory device 150. The ECC decoder may detect and correct errors contained in data read from the memory device 150, when the controller 130 reads the data stored in the memory device 150. In other words, after performing error correction decoding on the data read from the memory device 150, the ECC circuit 138 may determine whether the error correction decoding has succeeded and output an instruction signal (e.g., a correction success signal or a correction fail signal). The ECC circuit 138 may use the parity bit which is generated during the ECC encoding process, for correcting the error bits of the read data. When the number of the error bits is greater than or equal to a threshold number of correctable error bits, the ECC circuit 138 may not correct error bits but may output an error correction fail signal indicating failure in correcting the error bits.

The ECC circuit 138 may perform an error correction operation based on a coded modulation such as a low density parity check (LDPC) code, a Bose-Chaudhuri-Hocquenghem (BCH) code, a turbo code, a Reed-Solomon (RS) code, a convolution code, a recursive systematic code (RSC), a trellis-coded modulation (TCM), or a Block coded modulation (BCM). The ECC circuit 138 may include any and all suitable circuits, modules, systems or devices for performing the error correction operation based on at least one of the above described codes.

The PMU 140 may manage electrical power provided in the controller 130.

The memory interface 142 may serve as an interface for handling commands and data transferred between the controller 130 and the memory device 150, to allow the controller 130 to control the memory device 150 in response to a request received from the host 102. The memory interface 142 may generate a control signal for the memory device 150 and may process data transmitted to the memory device 150 or received from the memory device 150 under the control of the processor 134 in a case when the memory device 150 is a flash memory (e.g., a NAND flash memory). The memory interface 142 may provide an interface for handling commands and data between the controller 130 and the memory device 150, for example, operations of NAND flash interface, in particular, operations between the controller 130 and the memory device 150. In an embodiment, the memory interface 142 may be implemented through firmware called a flash interface layer (FIL) as a component for exchanging data with the memory device 150.

The memory 144 may support operations performed by the memory system 110 and the controller 130. The memory 144 may store temporary or transactional data which occur or are delivered for operations of the memory system 110 and the controller 130. The controller 130 may control the memory device 150 in response to a request from the host 102. The controller 130 may deliver data read from the memory device 150 into the host 102. The controller 130 may store data, which is received through the host 102, in the memory device 150. The memory 144 may be used to store data required for the controller 130 and the memory device 150 to perform operations such as read operations and/or program/write operations.

The memory 144 may be implemented with a volatile memory. The memory 144 may be implemented with a static random access memory (SRAM), a dynamic random access memory (DRAM) or both. Although FIG. 1 exemplifies the memory 144 disposed within the controller 130, the invention is not limited thereto. That is, the memory 144 may be disposed within or externally to the controller 130. For instance, the memory 144 may be embodied by an external volatile memory having a memory interface, through which data and/or signals are transferred between the memory 144 and the controller 130.

The memory 144 may store data for performing operations such as a program operation and a read operation, which are requested by the host 102. Further, the memory 144 may transfer data between the memory device 150 and the controller 130 for background operations such as garbage collection, and wear levelling. In an embodiment, for supporting operations of the memory system 110, the memory 144 may include a program memory, a data memory, a write buffer/cache, a read buffer/cache, a data buffer/cache, and a map buffer/cache.

The processor 134 may be implemented with a microprocessor or a central processing unit (CPU). The memory system 110 may include one or more processors 134. The processor 134 may control the overall operations of the memory system 110. By way of example but not limitation, the processor 134 may control a program operation or a read operation of the memory device 150, in response to a write request or a read request from the host 102. In an embodiment, the processor 134 may use or execute firmware to control the overall operations of the memory system 110. Herein, the firmware may be referred to as a flash translation layer (FTL). The FTL may perform an operation as an interface between the host 102 and the memory device 150. The host 102 may transmit requests for write and read operations to the memory device 150 through the FTL.

The FTL may manage operations of address mapping, garbage collection, and wear leveling. Particularly, the FTL may load, generate, update, or store map data. Therefore, the controller 130 may map a logical address, which is received from the host 102, with a physical address of the memory device 150 through the map data. The memory device 150 may perform a read or write operation because of the address mapping operation. Also, through the address mapping operation based on the map data, when the controller 130 tries to update data stored in a particular page, the controller 130 may program the updated data on another empty page and may invalidate old data of the particular page (e.g., update a physical address, corresponding to a logical address of the updated data, from the previous particular page to the another newly programed page) due to a characteristic of a flash memory device. Further, the controller 130 may store map data of the new data into the FTL.

The controller 130 may perform an operation requested from the host 102 in the memory device 150, using the processor 134. The processor 134 may be engaged with the memory device 150 and may handle instructions or commands corresponding to a command received from the host 102. The controller 130 may perform a foreground operation as a command operation, corresponding to an command received from the host 102, such as a program operation corresponding to a write command, a read operation corresponding to a read command, an erase (or discard) operation corresponding to an erase (or discard) command, and a parameter set operation corresponding to a set parameter command or a set feature command with a set command.

The controller 130 may perform a background operation on the memory device 150 through the processor 134. By way of example but not limitation, the background operation includes a garbage collection (GC) operation of copying data stored in a memory block among the memory blocks 152, 154, 156 in the memory device 150 and storing such data in another memory block. The background operation may include a wear leveling (WL) operation to move or swap data among memory blocks. The background operation may include an operation of storing map data stored in the controller 130 in at least one of the memory blocks 152, 154, 156 in the memory device 150, e.g., a map flush operation. The background operation may include a bad block management operation for checking for bad blocks in the plurality of memory blocks 152, 154, 156 in the memory device 150 and process the bad block(s).

In an embodiment, the bad word line list 1040 and the accumulated bad word line list 1060 in FIG. 1 may be generated by the processor 134 in the controller 130 and may be stored in the memory 144.

The controller 130 performs a plurality of command operations corresponding to a plurality of commands from the host 102. For example, when performing a plurality of read operations corresponding to plural read commands and a plurality of erase operations corresponding to plural erase commands sequentially, randomly or alternatively, the controller 130 may determine, which channel or way in a plurality of channels (or ways), to use for connecting the controller 130 to a plurality of memory dies in the memory 150 is proper or appropriate for performing each operation. The controller 130 may transmit data or instructions via determined channels or ways for performing each operation. The plurality of memory dies in the memory 150 may transmit an operation result via the same channels or ways, respectively, after each operation is complete. Then, the controller 130 may transmit a response or an acknowledge signal to the host 102. In an embodiment, the controller 130 may check a status of each channel or each way. In response to a command from the host 102, the controller 130 may select at least one channel or way based on the status of each channel or each way so that instructions and/or operation results with data may be delivered via the selected channel(s) or way(s).

By way of example but not limitation, the controller 130 may recognize statuses regarding a plurality of channels (or ways) associated with a plurality of memory dies in the memory device 150. The controller 130 may determine each channel or each way to be in one of a busy state, a ready state, an active state, an idle state, a normal state, and/or an abnormal state. The determination of the controller 130 may be associated with a physical block address. The controller 130 may refer to descriptors from the memory device 150. The descriptors may include parameters that describe a characteristic of the memory device 150. The descriptors may be data with a set format or structure. For instance, the descriptors may include device descriptors, configuration descriptors, and/or unit descriptors. The controller 130 may refer to, or use, the descriptors to determine which channel(s) or way(s) an instruction or data is exchanged via.

A management unit (not shown) may be included in the processor 134. The management unit may perform bad block management of the memory device 150. The management unit may find bad memory blocks in the memory device 150, which are in unsatisfactory condition for further use. Further, the management unit may perform bad block management on the bad memory blocks. When the memory device 150 is a flash memory (for example, a NAND flash memory), a program failure may occur during the write operation (or the program operation), due to characteristics of a NAND logic function. During the bad block management, the data of the program-failed memory block or the bad memory block may be programmed into a new memory block. The bad blocks may seriously aggravate the utilization efficiency of the memory device 150 having a three-dimensional (3D) structure and the reliability of the memory system 110. Thus, reliable bad block management may enhance or improve performance of the memory system 110.

Figure 3:
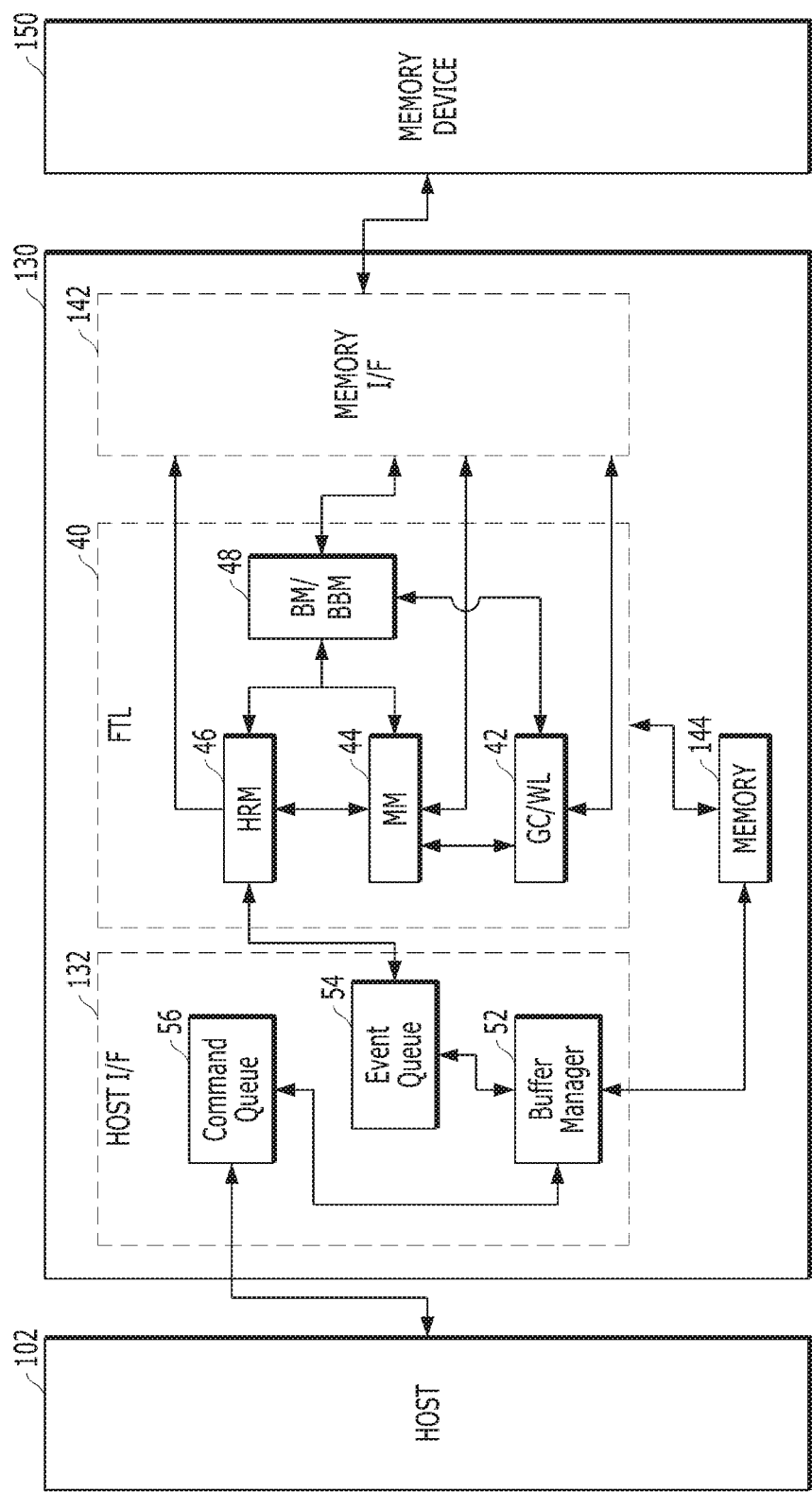
FIG. 3 is a diagram illustrating a controller in a memory system in accordance with an embodiment of the disclosure.

FIG. 3 illustrates a controller in a memory system in accordance with an embodiment of the disclosure. Referring to FIG. 3, the controller 130 cooperates with the host 102 and the memory device 150. The controller 130 may include a host interface 132, a flash translation layer (FTL) 40, a memory interface 142 and a memory 144.

Although not shown in FIG. 3, the ECC circuit 138 in FIG. 2 may be included in the flash translation layer 40. In another embodiment, the ECC circuit 138 may be implemented as a separate module, a circuit, or firmware, which is included in the controller 130.

The host interface 132 may handle commands, and data, received from the host 102. By way of example but not limitation, the host interface 132 may include a buffer manager 52, an event queue 54 and a command queue 56. The command queue 56 may sequentially store commands and data, received from the host 102, and output the commands and the data to the buffer manager 52 in a stored order. The buffer manager 52 may classify, manage or adjust the commands and the data, which are delivered from the command queue 56. The event queue 54 may sequentially transmit events for processing the commands and the data, received from the buffer manager 52.

A plurality of commands or data having the same characteristics may be continuously received from the host 102. Alternatively, a plurality of commands and data having different characteristics may be received from the host 102 after being mixed or jumbled. For example, a plurality of commands for reading data (i.e., read commands) may be delivered, or read commands and programming/writing data (i.e., write commands) may be alternately transmitted to the memory system 110. The host interface 132 may store commands and data, which are received from the host 102, to the command queue 56 sequentially. Thereafter, the host interface 132 may estimate or predict what kind of operation the controller 130 will perform according to the characteristics of the command and the data. The host interface 132 may determine a processing order and a priority of commands and data, based at least on their characteristics. According to characteristics of commands and data, the buffer manager 52 may determine whether to store commands and data in the memory 144, or whether to deliver the commands and the data into the flash translation layer 40. The event queue 54 receives events, from the buffer manager 52, which are to be internally executed and processed by the memory system 110 or the controller 130 in response to the commands and the data so as to deliver the events into the flash translation layer 40 in the order received.

In an embodiment, the host interface 132 may perform the functions of the controller 130 of FIG. 1. The host interface 132 may set a memory of the host 102 as a slave and add the memory as an additional storage space which is controllable or usable by the controller 130.

In an embodiment, the flash translation layer 40 may include a state manager (SM) 42, a map manager (MM) 44, a host request manager (HRM) 46, and a block manager (BM) 48. The host request manager 46 may manage the events from the event queue 54. The map manager 44 may handle or control map data. The state manager 42 may perform garbage collection (GC) or wear leveling (WL). The block manager 48 may execute commands or instructions on a block in the memory device 150.

By way of example but not limitation, the host request manager 46 may use the map manager 44 and the block manager 48 to handle or process requests according to the read and program commands, and events which are delivered from the host interface 132. The host request manager 46 may send an inquiry request to the map data manager 44 to figure out a physical address corresponding to the logical address which is received with the events. The host request manager 46 may send a read request with the physical address to the memory interface (I/F) 142, to process the read request (i.e., handle the events). Further, the host request manager 46 may send a program request (or write request) to the block manager 48 to program received data to a specific page in the memory device 150. Then, the host request manager 46 may transmit a map update request corresponding to the program request to the map manager 44 to update an item relevant to the programmed data in mapping information between logical addresses and physical addresses.

The block manager 48 may convert a program request delivered from the host request manager 46, the map data manager 44, and/or the state manager 42 into a program request used for the memory device 150, to manage memory blocks in the memory device 150. In order to maximize or enhance program or write performance of the memory system 110 (see FIG. 2), the block manager 48 may collect program requests and send program requests for multiple-plane and one-shot program operations to the memory interface 142. The block manager 48 sends several program requests to the memory interface 142 to enhance or maximize parallel processing of the multi-channel and multi-directional flash controller.

The block manager 48 may manage blocks in the memory device 150 according to the number of valid pages. Further, the block manager 48 may select and erase blocks having no valid pages when a free block is needed. Furthermore, the block manager 48 may select a block including the least valid page when it is determined that garbage collection is necessary. The state manager 42 may perform garbage collection to move the valid data to an empty block and erase the blocks containing the moved valid data so that the block manager 48 may have enough free blocks (i.e., empty blocks with no data). If the block manager 48 provides information regarding a block to be erased to the state manager 42, the state manager 42 may check all pages of the block to be erased to determine whether each page is valid. For example, in order to determine validity of each page, the state manager 42 may identify a logical address stored in an out-of-band (OOB) area of each page. To determine whether each page is valid, the state manager 42 may compare the physical address of the page with the physical address mapped to the logical address obtained from the inquiry request. The state manager 42 may send a program request to the block manager 48 for each valid page. A mapping table may be updated by the map manager 44 when the program operation is completed.

The map manager 44 may manage a logical-to-physical mapping table. The map manager 44 may process requests such as queries and updates, which are generated by the host request manager 46 or the state manager 42. The map manager 44 may store the entire mapping table in the memory device 150 (e.g., a non-volatile memory such as a flash memory) and cache mapping entries according to the storage capacity of the memory 144. When a map cache miss occurs while processing inquiry or update requests, the map manager 44 may send a read request to the memory interface 142 to load a relevant mapping table stored in the memory device 150. When the number of dirty cache blocks in the map manager 44 exceeds a certain threshold, a program request may be sent to the block manager 48 so that a clean cache block is made and the dirty map table may be stored in the memory device 150.

When garbage collection is performed, the state manager 42 copies valid page(s) into a free block, and the host request manager 46 may program the latest version of the data for the same logical address of the page, and may currently issue an update request. When the status manager 42 requests the map update in a state in which copying of valid page(s) is not completed properly, the map manager 44 may not perform the mapping table update. This is because the map request is issued with old physical information if the status manger 42 requests a map update and a valid page copy is completed later. The map manager 44 may perform a map update operation to ensure accuracy only if the latest map table still points to the old physical address.

In an embodiment, the bad word line list 1040 and the accumulated bad word line list 1060 in FIG. 1 may be generated by at least one of the status manager 42 and the map manager 44 and may be stored in the memory 144.

The memory device 150 may include a plurality of memory blocks. Each of memory blocks may be a single level cell (SLC) memory block, or a multi-level cell (MLC) memory block, according to the number of bits that can be stored or represented in one memory cell in that block. Here, the SLC memory block includes a plurality of pages implemented by memory cells, each storing one bit of data. The SLC memory block may have high performance and high durability. The MLC memory block includes a plurality of pages implemented by memory cells, each storing multi-bit data (e.g., two bits or more). The MLC memory block may have larger storage capacity in the same space than the SLC memory block. In general, an MLC memory block may also include higher capacity memory blocks, such as a triple level cell (TLC) memory block and a quadruple level cell (QLC) memory block. Thus, the term MLC memory block may be reserved for a type of block that includes a plurality of pages implemented by memory cells, each capable of storing 2-bit data. The TLC memory block may include a plurality of pages implemented by memory cells, each capable of storing 3-bit data. The QLC memory block may include a plurality of pages implemented by memory cells, each capable of storing 4-bit data. In another embodiment, the memory device 150 may be implemented with a block including a plurality of pages implemented by memory cells, each capable of storing 5-bit or more bit data.

In an embodiment, the memory device 150 is embodied with a nonvolatile memory such as a flash memory for example, a NAND flash memory, or a NOR flash memory. Alternatively, the memory device 150 may be implemented with at least one of a phase change random access memory (PCRAM), a ferroelectrics random access memory (FRAM), a spin injection magnetic memory, and a spin transfer torque magnetic random access memory (STT-MRAM).

Figure 4:
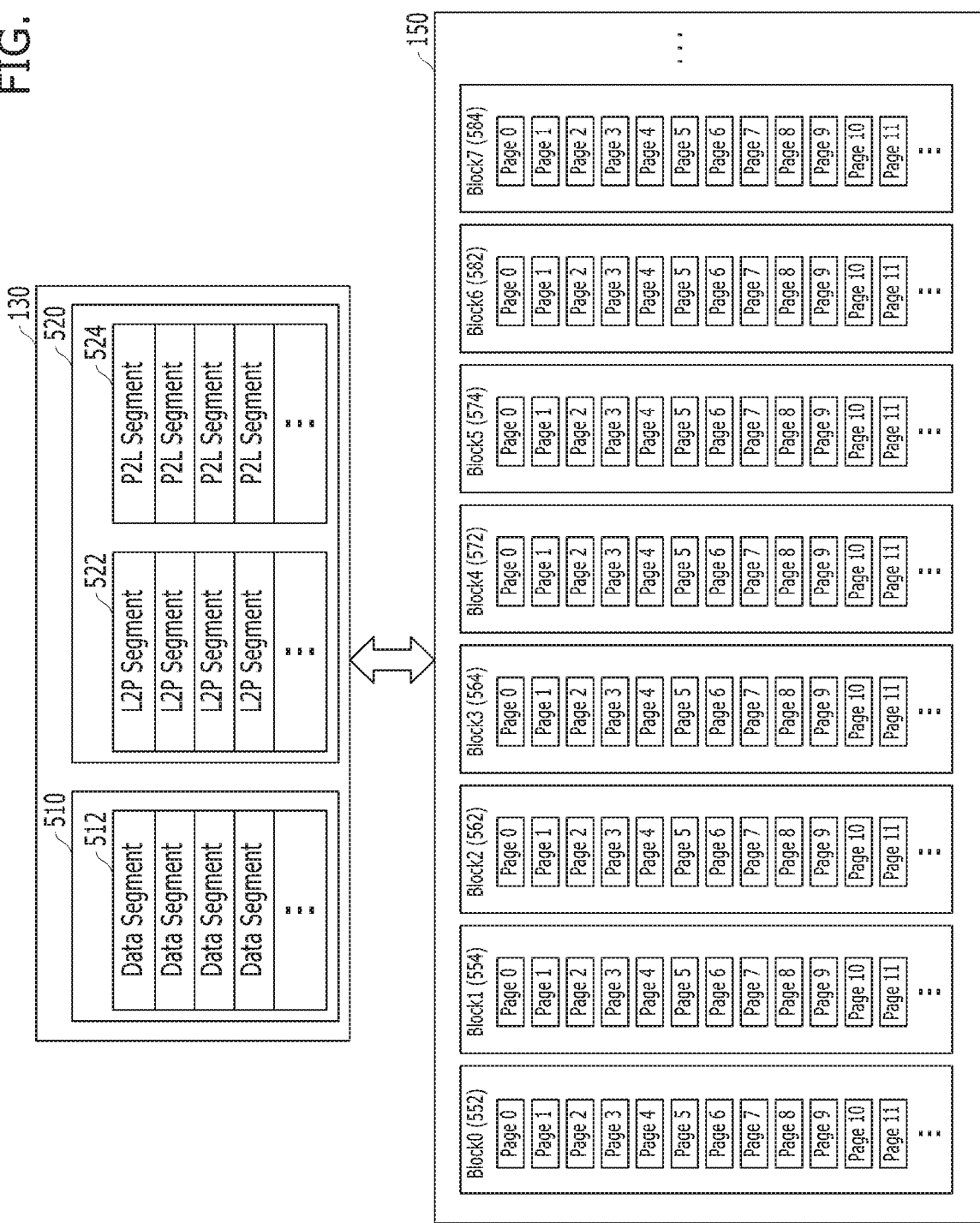
FIGS. 4 and 5 are diagrams illustrating examples of a plurality of command operations corresponding to a plurality of commands, which are performed by a memory system.
Figure 5:
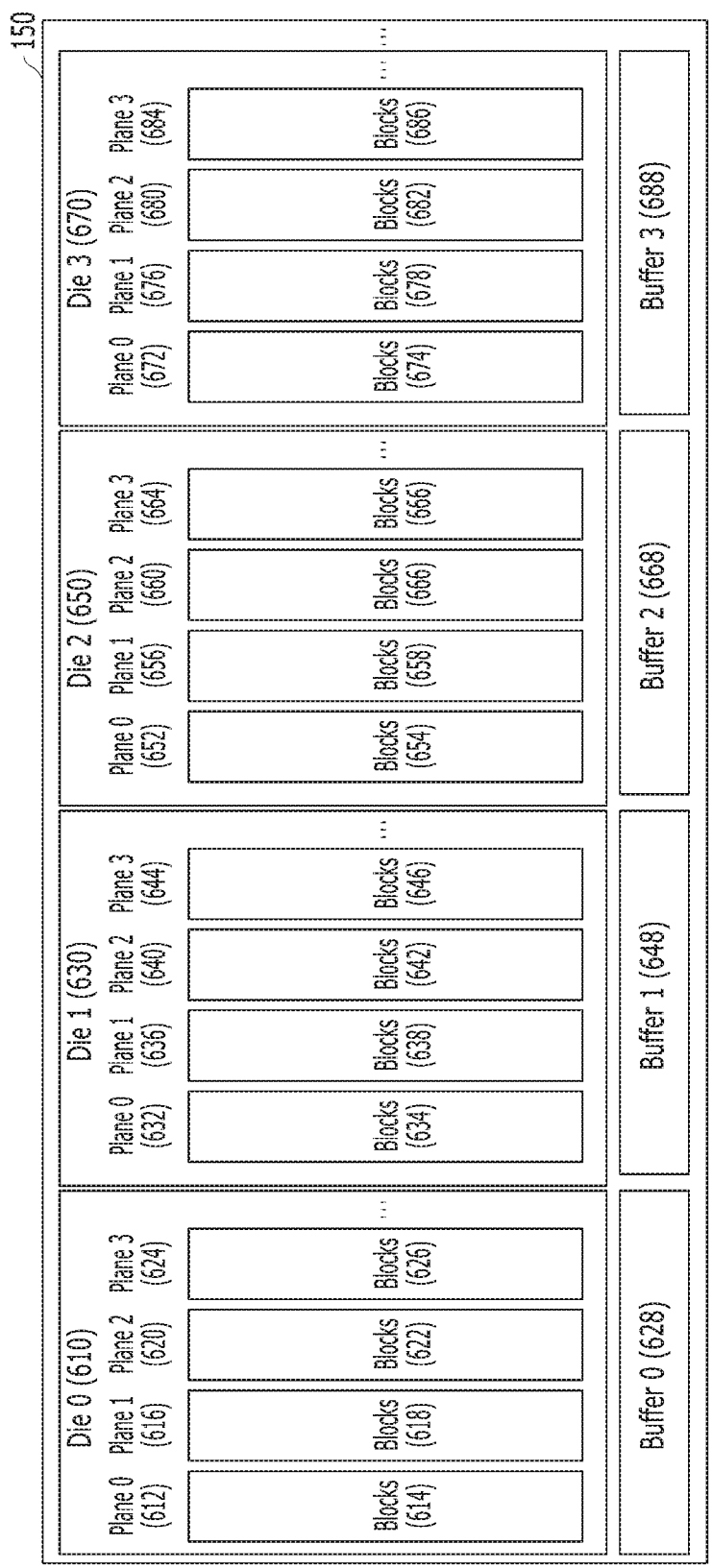

FIGS. 4 and 5 illustrate performing a plurality of command operations corresponding to a plurality of commands in the memory system in accordance with an embodiment of the disclosure. A data processing operation as described below may be any of the following cases: a case where a plurality of write commands are received from the host 102 and program operations corresponding to the write commands are performed; a case where a plurality of read commands are received from the host 102 and read operations corresponding to the read commands are performed; a case where a plurality of erase commands are received from the host 102 and erase operations corresponding to the erase commands are performed; and a case where a plurality of write commands and a plurality of read commands are received together from the host 102 and program operations and read operations corresponding to the write commands and the read commands are performed.

Write data corresponding to a plurality of write commands from the host 102 are stored in a buffer/cache in the memory 144 of the controller 130. The write data stored in the buffer/cache are programmed to and stored in a plurality of memory blocks in the memory device 150. Map data corresponding to the stored write data are updated in the plurality of memory blocks. The updated map data are stored in the plurality of memory blocks in the memory device 150. In an embodiment, program operations corresponding to a plurality of write commands from the host 102 are performed. Furthermore, when a plurality of read commands are received from the host 102 for the data stored in the memory device 150, data corresponding to the read commands are read from the memory device 150 by checking the map data regarding the data corresponding to the read commands. Further, the read data are stored in the buffer/cache in the memory 144 of the controller 130, and the data stored in the buffer/cache are provided to the host 102. In other words, read operations corresponding to a plurality of read commands from the host 102 are performed. In addition, when a plurality of erase commands are received from the host 102 for the memory blocks in the memory device 150, memory blocks are checked corresponding to the erase commands, and the data stored in the checked memory blocks are erased. Further, map data are updated corresponding to the erased data, and the updated map data are stored in the plurality of memory blocks in the memory device 150. Namely, erase operations corresponding to a plurality of erase commands from the host 102 are performed.

When the controller 130 performs command operations in the memory system 110, it is to be noted that, as described above, the processor 134 of the controller 130 may perform command operations in the memory system 110 through a flash translation layer (FTL). Also, the controller 130 programs and stores user data and metadata corresponding to write commands from the host 102, in memory blocks among the plurality of memory blocks in the memory device 150. Further, the controller 130 reads user data and metadata corresponding to read commands from the host 102, from memory blocks among the plurality of memory blocks in the memory device 150, and provides the read data to the host 102. Furthermore, the controller 130 erases user data and metadata, corresponding to erase commands entered from the host 102, from memory blocks among the plurality of memory blocks in the memory device 150.

Metadata may include first map data including logical/physical or logical to physical (L2P) information (logical information), and second map data including physical/logical or physical to logical (P2L) information (physical information), for data stored in memory blocks corresponding to a program operation. The metadata may include information on command data corresponding to a command from the host 102, information on a command operation corresponding to the command, information on the memory blocks of the memory device 150 for which the command operation is to be performed, and information on map data corresponding to the command operation. In other words, metadata may include plural information and data excluding user data corresponding to a command from the host 102.

In an embodiment, when the controller 130 receives a plurality of write commands from the host 102, program operations corresponding to the write commands are performed. In other words, user data corresponding to the write commands are stored in empty memory blocks, open memory blocks, or free memory blocks for which an erase operation has been performed, among the memory blocks of the memory device 150. Also, first map data and second map data are stored in empty memory blocks, open memory blocks, or free memory blocks among the memory blocks of the memory device 150. First map data may include an L2P map table or an L2P map list including logical information as the mapping information between logical addresses and physical addresses for the user data stored in the memory blocks. Second map data may include a P2L map table or a P2L map list including physical information as the mapping information between physical addresses and logical addresses for the memory blocks stored with the user data.

When write commands are received from the host 102, the controller 130 stores user data corresponding to the write commands in memory blocks. The controller 130 stores, in other memory blocks, metadata including first map data and second map data for the user data stored in the memory blocks. Particularly, the controller 130 generates and updates the L2P segments of first map data and the P2L segments of second map data as the map segments of map data, which correspond to data segments of the user data stored in the memory blocks of the memory device 150. The controller 130 stores the updated L2P and P2L segments in the memory blocks of the memory device 150. The map segments stored in the memory blocks of the memory device 150 are loaded in the memory 144 of the controller 130 and are then updated.

When a plurality of read commands are received from the host 102, the controller 130 reads read data corresponding to the read commands, from the memory device 150, and stores the read data in the buffers/caches in the memory 144 of the controller 130. The controller 130 provides the data stored in the buffers/caches, to the host 102.

When a plurality of erase commands are received from the host 102, the controller 130 checks memory blocks of the memory device 150 corresponding to the erase commands, and performs erase operations for the memory blocks.

When command operations corresponding to the plurality of commands from the host 102 are performed while a background operation is performed, the controller 130 loads and stores data corresponding to the background operation (that is, metadata and user data) in the buffer/cache in the memory 144. Then, the controller 130 stores the metadata and the user data in the memory device 150. By way of example but not limitation, the background operation may include a garbage collection operation or a read reclaim operation as a copy operation, a wear leveling operation as a swap operation or a map flush operation. For the background operation, the controller 130 may check metadata and user data corresponding to the background operation, in the memory blocks of the memory device 150. Further, the controller 130 may load and store the metadata and user data stored in certain memory blocks of the memory device 150 in the buffer/cache of the memory 144, and then store the metadata and user data, in certain other memory blocks of the memory device 150.

In the case of performing command operations as foreground operations, and a copy operation, a swap operation and a map flush operation as background operations, the controller 130 schedules queues corresponding to the foreground operations and the background operations. Further, the controller 130 allocates the scheduled queues to the memory 144 of the controller 130 and a memory of the host 102. In this regard, the controller 130 assigns identifiers (IDs) by respective operations for the foreground operations and the background operations to be performed in the memory device 150. Further, the controller 130 schedules queues corresponding to the operations assigned with the identifiers, respectively. In an embodiment, identifiers are assigned not only by respective operations for the memory device 150 but also by functions for the memory device 150, and queues corresponding to the functions assigned with respective identifiers are scheduled.

In an embodiment, the controller 130 manages the queues scheduled by the identifiers of respective functions and operations to be performed in the memory device 150. The controller 130 manages the queues scheduled by the identifiers of a foreground operation and a background operation to be performed in the memory device 150. In an embodiment, after memory regions corresponding to the queues scheduled by identifiers are allocated to the memory 144 and a memory in the host 102, the controller 130 manages addresses for the allocated memory regions. The controller 130 performs not only the foreground operation and the background operation but also respective functions and operations in the memory device 150, by using the scheduled queues.

Referring to FIG. 4, the controller 130 performs command operations corresponding to a plurality of commands from the host 102.

For example, the controller 130 performs program operations corresponding to a plurality of write commands from the host 102. The controller 130 programs and stores user data corresponding to the write commands in memory blocks of the memory device 150. In correspondence to the program operations with respect to the memory blocks, the controller 130 generates and updates metadata for the user data and stores the metadata in the memory blocks of the memory device 150.

The controller 130 generates and updates first map data and second map data which include information indicating that the user data are stored in pages in the memory blocks of the memory device 150. That is, the controller 130 generates and updates L2P segments as the logical segments of the first map data and P2L segments as the physical segments of the second map data. Then, the controller 130 stores the L2P and P2L segments in pages of the memory blocks of the memory device 150.

For example, the controller 130 caches and buffers the user data corresponding to the write commands from the host 102, in a first buffer 510 as a data buffer/cache of the memory 144. Particularly, after storing data segments 512 of the user data in the first buffer 510, the controller 130 stores the data segments 512 of the first buffer 510 in pages of the memory blocks of the memory device 150. As the data segments 512 are programmed to and stored in the pages of the memory blocks of the memory device 150, the controller 130 generates and updates the first map data and the second map data. The controller 130 stores the first map data and the second map data in a second buffer 520 of the memory 144. Particularly, the controller 130 stores L2P segments 522 of the first map data and P2L segments 524 of the second map data for the user data, in the second buffer 520 as a map buffer/cache. As described above, the L2P segments 522 and the P2L segments 524 may be stored in the second buffer 520 of the memory 144. A map list for the L2P segments 522 and another map list for the P2L segments 524 may be stored in the second buffer 520. The controller 130 stores the L2P segments 522 and the P2L segments 524, which are stored in the second buffer 520, in pages of the memory blocks of the memory device 150.

The controller 130 performs command operations corresponding to a plurality of commands received from the host 102.

For example, the controller 130 performs read operations corresponding to a plurality of read commands received from the host 102. Particularly, the controller 130 loads L2P segments 522 of first map data and P2L segments 524 of second map data as the map segments of user data corresponding to the read commands, in the second buffer 520. Further, the controller 130 checks the L2P segments 522 and the P2L segments 524. Then, the controller 130 reads the user data stored in pages of corresponding memory blocks among the memory blocks of the memory device 150, stores data segments 512 of the read user data in the first buffer 510, and then provides the data segments 512 to the host 102.

The controller 130 performs command operations corresponding to a plurality of commands received from the host 102. For example, the controller 130 performs erase operations corresponding to a plurality of erase commands from the host 102. In particular, the controller 130 checks memory blocks corresponding to the erase commands among the memory blocks of the memory device 150 to carry out the erase operations for the checked memory blocks.

In the case of performing an operation of copying data or swapping data among the memory blocks in the memory device 150, for example, a garbage collection operation, a read reclaim operation or a wear leveling operation, as a background operation, the controller 130 stores data segments 512 of corresponding user data, in the first buffer 510, and loads map segments 522, 524 of map data corresponding to the user data, in the second buffer 520. Then, the controller 130 performs the garbage collection operation, the read reclaim operation, or the wear leveling operation. In the case of performing a map update operation and a map flush operation for metadata, e.g., map data, for the memory blocks of the memory device 150 as a background operation, the controller 130 loads the corresponding map segments 522, 524 in the second buffer 520, and then performs the map update operation and the map flush operation.

As aforementioned, in the case of performing functions and operations including a foreground operation and a background operation for the memory device 150, the controller 130 assigns identifiers by the functions and operations to be performed for the memory device 150. The controller 130 schedules queues respectively corresponding to the functions and operations assigned with the identifiers, respectively. The controller 130 allocates memory regions corresponding to the respective queues to the memory 144 of the controller 130 and the memory of the host 102. The controller 130 manages the identifiers assigned to the respective functions and operations, the queues scheduled for the respective identifiers and the memory regions allocated to the memory 144 and the memory of the host 102 corresponding to the queues, respectively. The controller 130 performs the functions and operations for the memory device 150, through the memory regions allocated to the memory 144 and the memory of the host 102.

Referring to FIG. 5, the memory device 150 includes a plurality of memory dies. For example, the memory device 150 includes a memory die 0, a memory die 1, a memory die 2 and a memory die 3. Each of the memory dies includes a plurality of planes, for example, a plane 0, a plane 1, a plane 2 and a plane 3. The respective planes include a plurality of memory blocks. For example, each plane includes N number of blocks Block0 to BlockN-1. Each block includes a plurality of pages, for example, 2M number of pages. Moreover, the memory device 150 includes a plurality of buffers corresponding to the respective memory dies. For example, the memory device 150 includes a buffer 0 corresponding to the memory die 0, a buffer 1 corresponding to the memory die 1, a buffer 2 corresponding to the memory die 2 and a buffer 3 corresponding to the memory die 3.

In the case of performing command operations corresponding to a plurality of commands from the host 102, data corresponding to the command operations are stored in buffers of the memory device 150. For example, in the case of performing program operations, data corresponding to the program operations are stored in the buffers, and are then stored in pages of the memory blocks. In the case of performing read operations, data corresponding to the read operations are read from the pages of the memory blocks, are stored in the buffers, and are then provided to the host 102 through the controller 130.

In the embodiment of the disclosure, the buffers of the memory device 150 are external to the respective corresponding memory dies. In another embodiment, however, the buffers may be disposed within the respective corresponding memory dies, and it is to be noted that the buffers may correspond to the respective planes or the respective memory blocks in the respective memory dies. Further, it is to be noted that the buffers may be a plurality of caches or a plurality of registers in the memory device 150.

The plurality of memory blocks in the memory device 150 may be grouped into a plurality of super memory blocks. Command operations may be performed in the plurality of super memory blocks. Each of the super memory blocks may include a plurality of memory blocks, for example, memory blocks in a first memory block group and a second memory block group. In the case where the first memory block group is included in the first plane of a certain first memory die, the second memory block group may be included in the first plane of the first memory die, may be included in the second plane of the first memory die or may be included in the planes of a second memory die.

In an embodiment of the disclosure, a data processing system may include plural memory systems. Each of the plural memory systems 110 may include the controller 130 and the memory device 150. In the data processing system, one of the plural memory systems 110 may be a master and the others may be a slave. The master may be determined based on contention between the plural memory systems 110. When a plurality of commands is received from the host 102, the master may determine a destination of each command based on statuses of channels or buses. For example, a first memory system may be determined as a master memory system among a plurality of memory systems, corresponding to information delivered from the plurality of memory systems. If the first memory system is determined as the master memory system, the remaining memory systems are considered slave memory systems. A controller of the master memory system may check statuses of a plurality of channels (or ways, buses) coupled to the plurality of memory systems, to select which memory system handles commands or data received from the host 102. In an embodiment, a master memory system may be dynamically determined among the plural memory systems. In another embodiment, a master memory system may be changed with one of the other slave memory systems periodically or according to an event.

Hereinafter, a method and apparatus for transferring data in the memory system 110 including the memory device 150 and the controller 130 is described in more detail. As the amount of data stored in the memory system 110 becomes larger, the memory system 110 may be required to read or store large amounts of data at a time. However, a read time for reading data stored in the memory device 150 or a program/write time for writing data in the memory device 150 may be generally longer than a handling time for the controller 130 to process data or a data transmission time between the controller 130 and the memory device 150. For example, the read time might be twice that of the handling time. Since the read time or the program time is relatively much longer than the handling time or the data transmission time, a procedure or a process for delivering data in the memory system 110 may affect performance of the memory system 110, e.g., an operation speed, and/or structure of the memory system 110, such as a buffer size.

Figure 6:
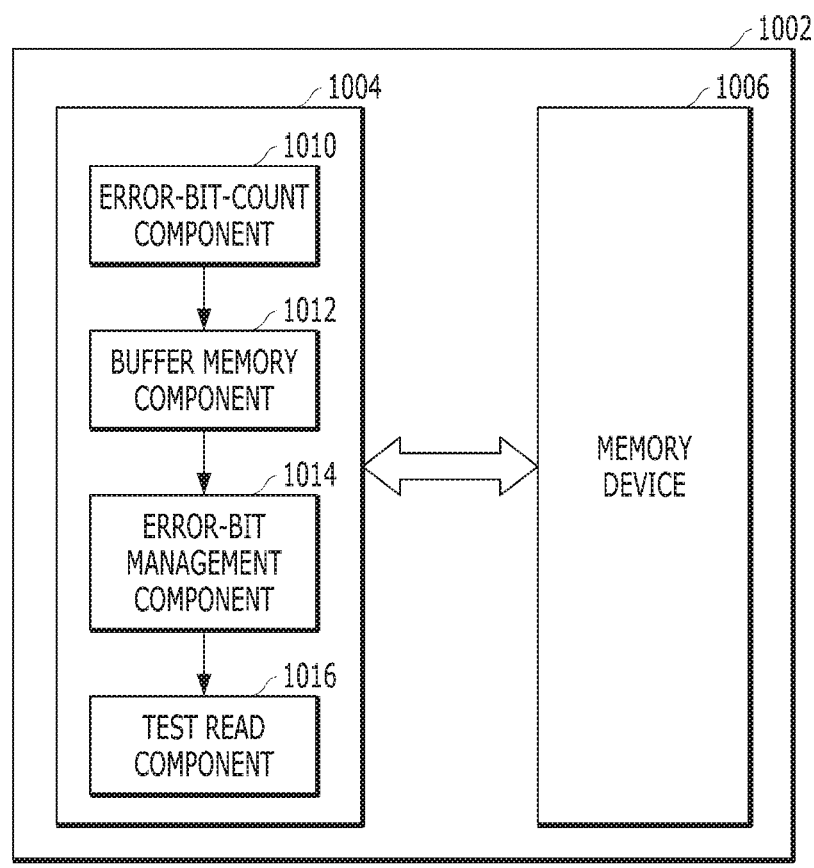
FIG. 6 is a diagram illustrating a memory system in accordance with an embodiment of the disclosure.

FIG. 6 illustrates a memory system 1002 in accordance with an embodiment of the disclosure. Referring to FIG. 6, the memory system 1002 may include a controller 1004 and a memory device 1006.

The controller 1004 may include an error-bit-count component 1010, a buffer memory component 1012, an error-bit management component 1014 and a test read component 1016. The error-bit-count component 1010, the buffer memory component 1012, the error-bit management component 1014 and the test read component 1016 include all circuits, systems, software, firmware and devices necessary for their respective operations and functions.

The memory device 1006 may include a plurality of memory blocks to store data. The controller 1004 improves an operation speed and an operation stability of the memory device 1006.

During a program operation or a write operation, the memory device 1006 may store data provided from the controller 1004. The memory device 1006 may provide the stored data to the controller 1004 during the read operation. The controller 1004 may erase the data stored in the memory device 1006 during an erase operation or a removal operation.

The plurality of pages are included in each of the plurality memory blocks to store data. Each of the plurality of pages may include a plurality of memory cells coupled to at least one word line.

The error-bit-count component 1010 may sum the number of error bits of the plurality of pages in each of the specific memory blocks among the plurality of memory blocks while the specific memory blocks among the plurality of memory blocks are selected and read through the read disturbance test. The error bits may be detected from data stored in memory cells coupled to respective word lines. The error bits may be detected word line by word line during the read disturbance test. Values of the error bits may be stored in a separate memory block of the memory device 1006.

In another embodiment, after the read disturbance tests are performed K number of times on the plurality of pages, the number of error bits detected during each read disturbance test may be accumulated and the values of the accumulated error bits may be stored in the memory device 1006. Herein, the error-bit-count component 1010 may sum the accumulated error bits, the values of which are stored in the memory device 1006.

The buffer memory component 1012 may store the values of the summed error bits and/or the accumulated error bits of the error-bit-count component 1010.

The error-bit management component 1014 may generate the bad word line list 1040 and/or the accumulated bad word line list 1060 of FIG. 1 based on the summed error bits and/or the accumulated error bits. Herein, the error-bit management component 1014 may generate the bad word line list 1040 and/or the accumulated bad word line list 1060 of FIG. 1 based on the summed error bits and/or the accumulated error bits such that the word lines having a greater number of error bits than the average are included in the bad word line list 1040 of FIG. 1 and/or such that the word lines having a greater number of the accumulated error bits than the average of the accumulated error bits are included in the accumulated bad word line list 1060 of FIG. 1.

The error-bit management component 1014 may arrange the bad word lines included in the bad word line list 1040 of FIG. 1 in ascending order or descending order according to the number of error bits. The error-bit management component 1014 may arrange the accumulated bad word lines included in the accumulated bad word line list 1060 of FIG. 1 in ascending order or descending order according to the accumulated number of error bits. Also, the error-bit management component 1014 may detect the word line having the greatest number of error bits as the worst word line using the bad word line list 1040 of FIG. 1. Furthermore, the error-bit management component 1014 may detect the word line having the greatest number of accumulated error bits as the worst accumulated word line using the accumulated bad word line list 1060 of FIG. 1.

The test read component 1016 may perform a test read operation on the plurality of memory blocks based on the bad word line list 1040 and/or the accumulated bad word line list 1060 of FIG. 1.

Herein, the controller 1004 may select the plurality of memory blocks according to the order defined in the bad word line list 1040 or the accumulated bad word line list 1060 of FIG. 1.

Figure 7:
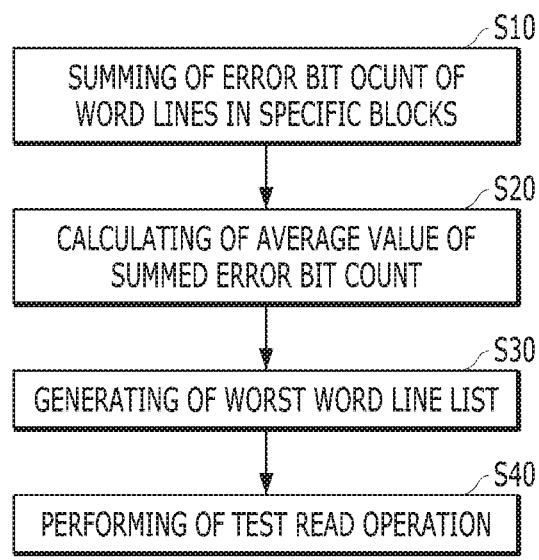
FIG. 7 is a flowchart illustrating an operation of a memory system in accordance with an embodiment of the disclosure.

FIG. 7 illustrates an operation method of a memory system in accordance with an embodiment of the disclosure.

Referring to FIG. 7, the operation method may include summing the number of error bits of word lines in specific blocks at step S10, calculating the average of the error bits at step S20, generating of the bad word line list at step S30 and performing of the test read operation at step S40.

In an embodiment, the error bits may be accumulated error bits as a result of K number of times of read disturbance test operations. In an embodiment, the average may be the average of the accumulated error bits. In an embodiment, the bad word line may be the accumulated bad word line list 1060.

More specifically, at step S10, values of the error bits and/or values of the accumulated error bits of the plurality of word lines in the specific memory blocks among the plurality of memory blocks may be stored in the memory device 1006. Subsequently, the controller 1004 may sum the error bits or the accumulated error bits of the word lines, the values of which are stored in the memory device 1006. Values of the summed error bits and/or the sum of the accumulated error bits may be stored in the controller 1004.

When an operation time of the read disturbance test operation exceeds a predetermined time, the read disturbance test operation may be terminated and values of the error bits and/or the accumulated error bits as a result of the so-far-performed read disturbance test operation are temporarily stored. Subsequently, a terminated read disturbance test operation may be resumed during an idle time or at a predetermined time.

The controller 1004 may perform the read disturbance test operation for detecting the error bits and/or the accumulated error bits from data stored in memory cells included in each of the plurality of pages coupled to M number of word lines in the specific memory block after a stress test is applied to N number of word lines in the specific memory block of the plurality of memory blocks, where M and N are natural numbers, and M is greater than N.

At step S20, the average of the error bits and/or the average of the accumulated error bits may be calculated based on the summed error bits and/or the sum of the accumulated error bits.

At step 30, the bad word line list 1040 of FIG. 1 or the accumulated bad word line list 1060 of FIG. 1 may be generated such that the word lines each having a greater number of error bits than the average of the error bits are included in the bad word line 1040 of FIG. 1 and/or the word lines each having a greater number of the accumulated error bits than the average of the accumulated error bits are included in the accumulated bad word line 1060 of FIG. 1.

Herein, the bad word lines included in the bad word line list 1040 of FIG. 1 or the accumulated bad word lines included in the accumulated bad word line list 1060 of FIG. 1 may be arranged in ascending order or descending order according to the number of error bits and/or the number of accumulated error bits.

At step S40, the test read operation may be performed based on the bad word line list 1040 of FIG. 1 or the accumulated bad word line list 1060 of FIG. 1.

As described above, an operation method of a memory system is in accordance with an embodiment of the disclosure may improve an operation speed and reliability of a memory system by generating the bad word line list based on a summed number of error bits of the word lines of the plurality memory blocks of the memory device and performing the test read operation based on the bad word line list.

While the disclosure illustrates and describes specific embodiments, it will be apparent to those skilled in the art in light of the present disclosure that various changes and modifications may be made without departing from the spirit and scope of the invention as defined in the following claims.

What is claimed is:

1. A memory system, comprising:
a memory device including a plurality of memory blocks, each block having a plurality of pages to store data; and
a controller suitable for:
detecting a number of error bits from data stored in the plurality of pages;
summing the number of error bits;
generating a bad word line list based on the sum of the error bits; and
performing a test read operation on the plurality of pages based on the bad word line list,
wherein the controller comprises:
an error-bit-count component suitable for summing the number of error bits word line by word line based on the error bits detected from a specific memory block among the plurality of memory blocks; and
an error-bit management component suitable for generating the bad word line list based on the sum, wherein the error-bit management component calculates an average of the sum, and includes word lines each having a greater number of error bits than the average in the bad word line list.

2. The memory system of claim 1, wherein the further controller comprises:
a buffer memory component suitable for storing a value of the sum; and
a test read component suitable for performing the test read operation on the plurality of pages in each of the plurality of memory blocks based on the bad word line list.

3. The memory system of claim 2, wherein the error-bit management component arranges the word lines in the bad word line list in an ascending order or a descending order according to a number of the error bits.

4. The memory system of claim 3, wherein the error-bit management component detects a word line having a greatest number of error bits from the bad word line list.

5. The memory system of claim 1, wherein the controller performs a read disturbance test operation for detecting and summing, by reading the plurality of pages coupled to M number of word lines in a specific memory block after a stress test is applied to N number of word lines in the specific memory block of the plurality of memory blocks, where M and N are natural numbers, and M is greater than N.

6. The memory system of claim 5, wherein the controller accumulates the error bits by repeatedly performing the read disturbance test operation on the plurality of pages in the specific memory block.

7. The memory system of claim 6, wherein the controller calculates an average of the accumulated error bits, and includes word lines each having a greater number of accumulated error bits than the average in the bad word line list.

8. The memory system of claim 7, wherein the controller arranges the word lines in the bad word line list in an ascending order or a descending order according to a number of the accumulated error bits.

9. An operation method of a memory system comprising:
detecting a number of error bits from data stored in a plurality of pages in a plurality of memory blocks of a memory device;
summing the number of error bits;
calculating an average of the summed error bits;
generating a bad word line list such that word lines each having a greater number of error bits than the average are included in the bad word line list; and
performing a test read operation based on the bad word line list.

10. The operation method of the memory system of claim 9, wherein the generating includes arranging the bad word lines in the bad word line list in an ascending order or a descending order according to a number of the error bits.

11. The operation method of the memory system of claim 10, wherein the generating includes detecting a word line having a greatest number of the error bits from the bad word line list.

12. The operation method of the memory system of claim 9, wherein the error bits are detected by reading the plurality of pages coupled to M number of word lines in a specific memory block after a stress test is applied to N number of word lines in the specific memory block of the plurality of memory blocks, where M and N are natural numbers, and M is greater than N.

13. The operation method of claim 12, wherein the summing includes accumulating the error bits by repeatedly performing a read disturbance test operation of detecting and summing on the plurality of pages in the specific memory block.

14. The operation method of claim 13,
wherein the summed error bits are the accumulated error bits, and
wherein the bad word line list is generated such that the word lines each having a greater number of the accumulated error bits than the average are included in the bad word line list.

15. A data processing system, comprising:
a host suitable for generating read data and a read command; and
a memory system comprising:
a memory device including a plurality of memory blocks, each block having a plurality of pages to store data; and
a controller suitable for:
detecting a number of error bits from data stored in the plurality of pages;
summing the number of error bits;
generating a bad word line list based on the sum of the error bits; and
performing a test read operation on the plurality of pages based on the bad word line list,
wherein the memory system calculates an average of the sum, and includes word lines each having a greater number of error bits than the average in the bad word line list.

16. The data processing system of claim 15, wherein the memory system arranges the word lines in the bad word line list in an ascending order or a descending order according to a number of the error bits.

17. The data processing system of claim 15,
wherein the memory system performs a read disturbance test operation of detecting and summing by reading the plurality of pages coupled to M number of word lines in a specific memory block after a stress test is applied to N number of word lines in the specific memory block of the plurality of memory blocks, where M and N are natural numbers, and M is greater than N, and
wherein the memory system accumulates the error bits by repeatedly performing the read disturbance test operation on the plurality of pages in the specific memory block.

18. The data processing system of claim 16, wherein the memory system detects a word line having a greatest number of error bits from the bad word line list.

* * * * *